United States Patent
Thompson et al.

(10) Patent No.: US 9,683,287 B2
(45) Date of Patent: Jun. 20, 2017

(54) DEPOSITION OF FILMS COMPRISING ALUMINUM ALLOYS WITH HIGH ALUMINUM CONTENT

(71) Applicant: Applied Materials, Inc., Santa Clara, CA (US)

(72) Inventors: David Thompson, San Jose, CA (US); Srinivas Gandikota, Santa Clara, CA (US); Xinliang Lu, Fremont, CA (US); Wei Tang, Santa Clara, CA (US); Jing Zhou, Milpitas, CA (US); Seshadri Ganguli, Sunnyvale, CA (US); Jeffrey W. Anthis, San Jose, CA (US); Atif Noori, Saratoga, CA (US); Faruk Gungor, San Jose, CA (US); Dien-Yeh Wu, San Jose, CA (US); Mei Chang, Saratoga, CA (US); Shih Chung Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 730 days.

(21) Appl. No.: 14/058,406

(22) Filed: Oct. 21, 2013

(65) Prior Publication Data
US 2014/0112824 A1 Apr. 24, 2014

Related U.S. Application Data

(60) Provisional application No. 61/717,366, filed on Oct. 23, 2012.

(51) Int. Cl.
*C23C 16/12* (2006.01)
*C23C 16/30* (2006.01)
*C23C 16/455* (2006.01)

(52) U.S. Cl.
CPC ........ *C23C 16/30* (2013.01); *C23C 16/45531* (2013.01); *C23C 16/45534* (2013.01)

(58) Field of Classification Search
None
See application file for complete search history.

(56) References Cited

U.S. PATENT DOCUMENTS

| | | | | |
|---|---|---|---|---|
| 6,458,701 B1 * | 10/2002 | Chae | ................ | C23C 16/0218 257/E21.168 |
| 7,198,820 B2 | 4/2007 | Harkonen et al. | | |
| 2002/0051847 A1 | 5/2002 | Akram | | |
| 2004/0208994 A1 | 10/2004 | Harkonen et al. | | |
| 2008/0194106 A1 * | 8/2008 | Oh | ................ | C23C 16/34 438/685 |
| 2008/0268642 A1 | 10/2008 | Yanagita et al. | | |
| 2009/0045514 A1 | 2/2009 | Ishizaka et al. | | |
| 2009/0315093 A1 | 12/2009 | Li et al. | | |
| 2011/0073832 A1 * | 3/2011 | Lim | ................ | H01L 27/2409 257/4 |

FOREIGN PATENT DOCUMENTS

CN 101015047 A 8/2007

OTHER PUBLICATIONS

PCT International Preliminary Report on Patentability in PCT/US2013/066342, mailed May 7, 2015, 10 pages.
PCT International Search Report and Written Opinion in PCT/US2013/066342, dated Jan. 27, 2014, 14 pages.

* cited by examiner

*Primary Examiner* — Joseph Miller, Jr.
(74) *Attorney, Agent, or Firm* — Servilla Whitney LLC

(57) ABSTRACT

Films comprising Aluminum, carbon and a metal, wherein the aluminum is present in an amount greater than about 16% by elemental content and the film has less than about 50% carbon. Methods of forming the films comprise exposing a substrate to a metal halide precursor, purging the metal halide precursor from the processing chamber and then exposing the substrate to an alkyl aluminum precursor and an alane precursor, either sequentially or simultaneously. The alane precrursor comprises an amine-alane and a stabilizing amine selected from one or more of diemthylcyclohexylamine or dicyclomethylhexylamine.

15 Claims, No Drawings

\# DEPOSITION OF FILMS COMPRISING ALUMINUM ALLOYS WITH HIGH ALUMINUM CONTENT

CROSS-REFERENCE PARAGRAPH

This application claims priority to U.S. Provisional Application No. 61/717,366, filed Oct. 23, 2012, the entire contents of which are hereby incorporated by reference.

TECHNICAL FIELD

Embodiments of the present invention generally relate to film deposition, and specifically to the deposition of films suitable as N-metal films.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures.

One category of films that are important is metal carbides. These films are incorporated in many applications, including in gate stacks. Some metal carbide process are known, including some that deposit films comprising relatively low amounts of aluminum. However, there has not yet been a process known to deposit an aluminum carbide film comprising relatively high levels of aluminum in the film. Additionally, in order to scale resistivity, which is required as aspect features reduce in size, there will be a need to reduce carbon content. Thus, there is a need for films and methods of depositing films which comprise relatively high amounts of aluminum, and/or relatively low amounts of carbon.

SUMMARY

One aspect of the invention relates to a film comprising aluminum, carbon and a metal, wherein the aluminum is present in an amount greater than about 16% by elemental content and less than about 50% carbon. In some embodiments, the metal is selected from the group consisting of Ti, Ta and Hf. In one or more embodiments, the aluminum is present in an amount greater than about 20% by elemental content. In some embodiments, the carbon is present in an amount less than about 30% by elemental content. In one or more embodiments, there is a ratio of metal to carbon of less than about 50% by elemental content.

A second aspect of the invention relates to a method of depositing a film, the method comprising: exposing a substrate surface to a metal halide precursor comprising a metal halide to provide a metal halide at the substrate surface; purging excess metal halide; exposing the substrate surface to one or more alkyl aluminum precursors comprising one or more of trimethyl aluminum, triethyl aluminum, dimethylaluminum hydride (DMAH), diethylhydridoaluminum, methyldihydroaluminum, and an alkyl aluminum hydrides of the formula $[(C_xH_y)_{3-a}AlH_a]_n$, wherein x has a value of 1 to 3, y has a value of 2x+2, a has a value of 1 to 2, and n has a value of 1 to 4. In some embodiments, the method further comprises exposing the substrate surface to an amine-alane and a stabilizing amine to provide an N-metal film comprising a metal aluminum alloy. In one or more embodiments, the substrate surface has a temperature of about 200 or 300 to about 400° C.

In some embodiments, exposure to the alkyl aluminum precursor occurs before exposure to the alane precursor. In one or more embodiments, exposure to the alkyl aluminum precursor occurs after exposure to the alane precursor. In some embodiments, the stabilizing amine is selected from dimethylcyclohexylamine and dicyclomethylhexylamine. In one or more embodiments, the metal is selected from one or more of Ti, Ta and Hf.

In some embodiments, the metal halide is selected from metal halide selected from the group consisting of $TiCl_4$, $TaCl_5$ and $HfCl_4$. In one or more embodiments, the exposure of the substrate surface to the alkyl aluminum at least partially overlaps with the exposure of the substrate surface to the alane precursor.

The method may comprise additional steps. In some embodiments, the method further comprises purging the alane precursor. In one or more embodiments, the method further comprises exposing the substrate surface to an amine, wherein the substrate surface is exposed to the amine while the substrate surface is exposed to the alkyl aluminum and/or the alane precursor. In some embodiments, soaking the N-metal film with an alloying agent, wherein the alloying agent comprises one or more of $SiH_4$, $GeH_4$, trimethylgallium, and $B_2H_6$. In one or more embodiments, the method further comprises exposing the substrate surface to a fourth precursor comprising one or more of dimethylethylamine, dimethylcyclohexylamine or pyrrolidine alane during exposure to of the substrate to the third precursor.

In one or more embodiments, the N-metal film contains less than 20% carbon. In some embodiments, the precursor is a vapor precursor. In one or more embodiments, the method is performed by CVD or ALD.

Another aspect of the invention relates to a film produced by any of the above-mentioned methods.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

In accordance with various embodiments of the invention, provided are methods related to the deposition of aluminum metal alloys which are suitable as N-metal films. In one or more embodiments, the films comprise aluminum, carbon and another metal. In one or more embodiments, the films provided herein contain an aluminum content of greater than about 16% by elemental content, which has not before been achieved. In some embodiments, the films described herein are highly conformally deposited. Furthermore, embodiments of the films described herein feature tunable metal and aluminum content, thus allowing for control over the properties of the deposited film.

Generally, embodiments of the methods describe introducing a metal halide to a substrate surface, purging the metal halide, introducing an alane source chemistry with stabilizing amine, and introducing an alkyl aluminum or alkyl aluminum hydride to the chamber. The introduction of alkyl aluminum precursor can take place before, during, or after introduction of the amine-alane with stabilizing amine. Optionally, purging may take place subsequent to exposure of the substrate to alane and/or alkyl aluminum precursors.

Accordingly, one aspect of the invention relates to a film comprising aluminum, carbon and a metal, wherein the aluminum is present in an amount greater than about 16% by elemental content. In further embodiments, the film comprises greater than 18%, 20%, 25%, 30%, or 40% aluminum by elemental content. In further embodiments, the film comprises less than about 50% aluminum by elemental content. As stated above, such high levels of aluminum content have not yet been achieved in films comprising aluminum, carbon and another metal Previously known similar films could not achieve such high levels of aluminum. Although not wishing to be bound to any particular theory, it is thought that in methods utilizing metal halides (e.g., $TiCl_4$ or $TaCl_5$) and alkyl aluminum precursors (e.g., trimethyl aluminum or triethyl aluminum), the halide ligand reacts with the Al atom to generate a moiety comprising the aluminum and replacement of the alkyl chains by one or more halide atoms. As this is a volatile product, the cycle results in a mostly alkyl-terminated metal surface. There may be surface reactions that take place with subsequent cycles, such as alkyl groups exchanged for halides when the metal halide is exposed to the alkyl-terminated metal surface, but there is no net grown reactions that take place, thus limiting the aluminum content.

Thus, by adding an alane precursor (e.g., an alane amine), it is thought that the alkyl-metal termination can be changed to a hydride-metal termination. The alane precursor may go through a CVD process, followed by surface transition. Once there is an aluminum-rich surface, the titanium may deposit on the subsequent cycles. In one or more embodiments, the ratio of Al:Ti is influenced by the ratio of alane to $TiCl_4$ pulses.

However, alanes can be very reactive, and thus may a stabilizing compound may be useful in such circumstances, particularly if the temperature is relatively high. Thus, in one or more embodiments, the temperature of deposition is above about 200, 250 or 300° C. In one embodiment, the deposition takes place at a temperature of between about 225, 250, 275 300 or 325° C. to about 350, 375, 400, or 425° C. Accordingly, in some embodiments of the invention, the alane precursor is stabilized with an amine. In further embodiments, the stabilizing amines have a relatively low vapor pressure. Non-limiting examples of such amines are dimethylcyclohexylamine (DMCA) and dicyclomethylhexylamine.

Embodiments of the films provided exhibit lower levels of carbon than previously encountered. In some embodiments, the carbon in the resulting film is less than about 50, 40, 30, 20, 15, 10 or 5% atomic ratio. While not wishing to be bound to any particular theory, it is thought that there may be an interaction between the alkyl aluminum and amine, which leads to a monomer having a structure represented by $R_3N \rightarrow$ alkyl aluminum, such that the monomers are less susceptible to incorporating carbon. Thus, for example, if DMAH is used, then the monomer $R_3N \rightarrow$ DMAH would be formed.

It is also thought that, in at least some embodiments, there is no direct reaction between the halide terminated surface and the alkyl aluminum. That is, it is thought that the alane removes the halide. As a result, it is thought that reduced levels of carbon are incorporated into the film. It is also thought that the alkyl aluminum functions one of two ways. The first possible route is that the alkyl aluminum deposits a conformal CVD aluminum film. In this case, the method may constitute a nanolaminate process of a Ti-rich TiAl film deposited by the alane precursor, metal halide and alkyl aluminum precursor. Alternatively, it is possible that the alkyl aluminum precursor soaks the Ti-rich TiAl film deposited from the alane precursor and metal halide with a thermally stably CVD aluminum source. The Ti-rich TiAl film is treated by the soaking to increase the aluminum content.

Thus, for example, one aspect of the invention relates to a method of depositing a film. The method comprises: exposing a substrate surface to a metal halide precursor comprising a metal halide to provide a metal halide at the substrate surface; purging excess metal halide; exposing the substrate surface to one or more alkyl aluminum precursors comprising one or more of trimethyl aluminum (TMA), triethyl aluminum (TEA), dimethyaluminum hydride, diethylhydridoaluminum, methyldihydroaluminum, and an alkyl aluminum hydrides of the formula $[(CxHy)_{3-a}AlH_a]_n$, wherein x has a value of 1 to 3, y has a value of 2x+2, a has a value of 1 to 2, and n has a value of 1 to 4. In some embodiments, the method further comprises exposing the substrate surface to an amine-alane and a stabilizing amine to provide an N-metal film comprising a metal aluminum alloy. In one or more embodiments, the substrate surface has a temperature of about 200 or 300 to about 400° C. The term "purge" means to remove any excess precursor, byproducts and other contaminants within the processing chamber. The carrier gas, the purge gas, or other process gas may contain nitrogen, hydrogen, argon, neon, helium, or combinations thereof. As used herein, the term "excess" in reference to a precursor means precursor that is not at the surface and/or is not otherwise available or needed for the deposition reaction. In one or more embodiments, the substrate may be exposed to more than one alkyl aluminum.

In one or more embodiments, the process above may proceed in various orders. For example, the alkyl aluminum precursor exposure may occur before or after exposure to the alane precursor and stabilizing amine or vice versa. In other embodiments, they may be co-flowed.

In one or more embodiments, exposure of the substrate surface to the alkyl aluminum at least partially overlaps with the exposure of the substrate surface to the alane precursor. In yet other embodiments, alkyl aluminum and alane precursors may be alternated, and may or may not feature some overlap in the flows.

In one or more embodiments, the methods may further comprise purging the alane precursor after the substrate surface is exposed to the alane precursor. This can be done to remove excess precursor.

In yet other embodiments, alkyl aluminum and alane precursors with or without stabilizing amines may be alternated, but feature some overlap in the flows. Thus, for example, in one or more embodiments, the exposure of the substrate surface to the alkyl aluminum at least partially overlaps with the exposure of the substrate surface to DMEAA.

Various embodiments of the invention relate to the use of alane (aluminum hydride or $AlH_3$) precursors coordinated to an amine. Alane is generally an unstable compound, but can be stabilized by coordination to an amine in some situations. Such precursors may be represented by the formula $AlH_3$—$NR_3$. These precursors may be synthesized according to the following equation 1:

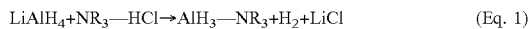

$$LiAlH_4+NR_3—HCl \rightarrow AlH_3—NR_3+H_2+LiCl \quad \text{(Eq. 1)}$$

Examples of such amines include, but are not limited to, dimethylethylamine alane (DMEAA), methylpyrrolidine alane (MPA), and di(methylpyrrolidine) alane (MP2A).

According to various embodiments of the invention, metal halides are also used as a precursor. The metals may be selected according to the desired metal film. In one in or more embodiments, the metal is selected from Ti, Ta and Hf. In one or more embodiments, the halide is selected from Cl, I and Br, such that the second precursor comprises a metal chloride, metal iodide or metal bromide. Thus, for example, the metal halide precursor may be selected from $TiCl_4$, $TaCl_5$ and $HfCl_4$.

The methods herein may feature additional sub-processes. For example, in one or more embodiments, the methods described above further comprise soaking the N-metal film with an alloying agent. As used herein, "soak" or "soaking" refers to a process wherein a substrate is exposed to a reactant gas, and the gas reacts with the surface, but does not deposit a layer. In further embodiments the alloying agent comprises one or more of $SiH_4$, $GeH_4$, trimethylgallium, and $B_2H_6$.

Other embodiments of the methods described herein may further comprise exposing the substrate surface to an amine, wherein the substrate surface is exposed to the amine while the substrate surface is exposed to the alkyl aluminum precursor and/or alane precursor.

In some embodiments, the methods may further comprise exposing the substrate surface to a fourth precursor comprising one or more of dimethylethylamine, dimethylcyclohexylamine or pyrrolidine alane during exposure to of the substrate to the third precursor. In further embodiments, the amine is flowed at least during substrate exposure to the alane precursor and/or alkyl aluminum precursor.

In one or more embodiments, the films are deposited using an ALD, CVD or PVD process. In embodiments relating to a CVD process, the substrate may be exposed to more than one precursor continuously simultaneously, or substantially simultaneously, as appropriate.

In other embodiments, films are deposited using an atomic layer deposition (ALD) process. Therefore, in one embodiment, contacting the substrate surface with two or more precursors occurs sequentially or substantially sequentially. In a more specific embodiment, the method comprises metal halide exposure, followed by purge, followed by exposure to DMAH, followed by another purge, followed by exposure to DMAH, followed by yet another purge. In exemplary embodiment of an ALD process, a first chemical precursor ("A") is pulsed or flowed, for example, $TiCl_4$ or $TaCl_5$, to the substrate surface in a first half reaction. Excess reactants and the reaction by-products are removed, typically by an evacuation-pump down and/or by a flowing inert purge gas. Then a precursor "B", for example an DMAH, is delivered to the surface, wherein the precursors of the first half reaction are reacted with new ligands from the "B" precursor, creating an exchange by-product. The "B" co-reactant also forms self saturating bonds with the underlying reactive species to provide a saturating second half reaction. A second purge period is typically utilized to remove unused reactants and the reaction by-products. A "C" precursor, for example DMEAA, may then be flowed simultaneously with or without a stabilizing amine to react with the underlying species, and then excess "C" precursor removed. The "A," "B," and "C" precursors and purge gases can then again be flowed. The alternating exposure of the surface to reactants is continued until the desired thickness film is reached, which for most anticipated applications would be approximately in the range of 5 A to 100 A, and more specifically from about 15 A, 20 A, 25 A or 30 A to about 45 A, 50 A, 55 A or 60 A. It will be understood that the reactants and purge gases can flow simultaneously, and the substrate and/or gas flow nozzle can oscillate such that the substrate is sequentially exposed to the reactant and purge gases as desired. Of course, the aforementioned ALD cycles are merely exemplary of a wide variety of ALD process cycles in which a deposited layer is formed by alternating layers of precursors and/or co-reactants.

The deposition process conditions may be any those suitable for the particular sequence being used. For example, in non-co-flow sequences, the metal halide may be flowed at a rate of from about 40, 50 or 60 sccm to about 90, 100 or 110 sccm with a chamber pressure of from about 2, 4, or 6 T to about 36, 38, 40 or 42 T. The purge and pump times may range from about 2, 4, or 6 seconds to about 18, 20 or 22 seconds. Exposure time may range from about 3, 5, or 7 seconds to about 48, 50 or 52 seconds. The alane precursor and/or stabilizing amine may be flowed at a rate of about 450, 500 or 550 sccm to about 950, 1000 or 1050 sccm, with a chamber pressure of about 2, 4 or 6 T to about 38, 40 or 42 T. The purge and pump times may range from about 2, 4, or 6 seconds to about 18, 20 or 22 seconds. Exposure time may range from about 3, 5, or 7 seconds to about 18, 20 or 22 seconds. The alkyl aluminum precursor may be flowed at a rate of about 450, 500 or 550 sccm to about 950, 1000 or 1050 sccm, with a chamber pressure of about 2, 4 or 6 T to about 38, 40 or 42 T. The purge and pump times may range from about 2, 4, or 6 seconds to about 18, 20 or 22 seconds. In embodiments where a fourth precursor (i.e., DMEA or DMCA) is used, the precursor may be flowed at a rate of from about 40, 50 or 60 sccm to about 90, 100 or 110 sccm with a chamber pressure of from about 2, 4, or 6 T to about 36, 38, 40 or 42 T. In some embodiments, the fourth precursor may be flowed with the alane precursor through the ampoule or may be mixed at the lid. In some embodiments, the purge and pump times will match those of the alane precursor. In one or more embodiments, the film may undergo a post-deposition anneal at a temperature of about 250, 275 or 300° C. to about 450, 475, or 500° C.

In embodiments relating to co-flows, the metal halide may be flowed at a rate of from about 40, 50 or 60 sccm to about 90, 100 or 110 sccm with a chamber pressure of from about 2, 4, or 6 T to about 36, 38, 40 or 42 T. The purge and pump times may range from about 2, 4, or 6 seconds to about 18, 20 or 22 seconds. Exposure time may range from about 3, 5, or 7 seconds to about 48, 50 or 52 seconds. The alane and alkyl aluminum precursors may be co-flowed at a rate of about 450, 500 or 550 sccm to about 950, 1000 or 1050 sccm, with a chamber pressure of about 2, 4 or 6 T to about 38, 40 or 42 T. The purge and pump times may range from about 2, 4, or 6 seconds to about 18, 20 or 22 seconds. Exposure time may range from about 3, 5, or 7 seconds to about 18, 20 or 22 seconds. In embodiments with a fourth precursor, the conditions will follow as described above.

The precursors and/or reactants may be in a state of gas or vapor or other state of matter useful for a vapor deposition process. During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and co-reactants.

A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, during the vapor deposition process. Also, a process may contain a purge gas or a carrier gas and not contain a reactive compound.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

One or more embodiments of the films provided by the processes described above are suitable as tunable N-metal films. The work functions of the films are tunable from quarter gap to band edge. The work function may be tuned by controlling the thickness of the film, or by increasing/decreasing the concentration of electronegative species. Work function tuning can be accomplished by doping with electronegative species (i.e., B, C, N, O, Cl, F) or silicon. Any suitable methods known in the art may be utilized to accomplish doping. Because the volume available for low resistivity fill is limited, lower resistivity of the work function materials is desired. In one or more embodiments, the N-metals provided allow for lower resistivity, and thus use of thinner layers. The thickness of the cap layers may also be of importance. Typical cap layers have a work function between midgap and PMOS band edge. In one or more embodiments, the cap layers are conformal layers comprising one or more of TaN, TiN and TiN, and may be doped with Si, Al, C, O or W. In one or more embodiments, the cap layers are conformal layers comprising one or more of WN, WCN, W and Co. In some embodiments, the work function material has a thickness ranging from about 15, 20, 25, or 30 A to about 35, 40 or 45 A.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing a film, the method comprising:
exposing a substrate surface in a processing chamber to a metal halide precursor comprising a metal halide to provide a metal halide at the substrate surface;
purging excess metal halide from the processing chamber leaving the metal halide at the substrate surface;
exposing the metal halide at the substrate surface to and alkyl aluminum precursor and an alane precursor to provide an N-metal film comprising a metal aluminum alloy, the alkyl aluminum precursors comprising one or more of trimethyl aluminum, triethyl aluminum, dimethyaluminum hydride, diethylhydridoaluminum, methyldihydroaluminum, a C1-C3 monoalkyl aluminum hydride or a C1-C3 dialkyl aluminum hydride, the alane precursor comprising an amine-alane and a stabilizing amine, the stabilizing amine selected from one or more of dimethylcyclohexylamine or dicyclomethylhexylamine.

2. The method of claim 1, wherein the aluminum is present in an amount greater than about 20% by elemental content.

3. The method of claim 2, wherein the carbon is present in an amount less than about 30% by elemental content.

4. The method of claim 1, wherein there is a ratio of metal to carbon of less than about 50% by elemental content.

5. The method of claim 1, wherein exposure to the alkyl aluminum precursor occurs before exposure to the alane precursor.

6. The method of claim 1, wherein exposure to the alkyl aluminum precursor occurs after exposure to the alane precursor.

7. The method of claim 1, wherein the metal is selected from one or more of Ti, Ta and Hf.

8. The method of claim 1, wherein the substrate surface has a temperature of about 200 to about 400° C.

9. The method of claim 5, wherein the exposure of the substrate surface to the alkyl aluminum at least partially overlaps with the exposure of the substrate surface to the alane precursor.

10. The method of claim 5, further comprising purging the alane precursor.

11. The method of claim 5, further comprising exposing the substrate surface to an amine, wherein the substrate surface is exposed to the amine while the substrate surface is exposed to the alkyl aluminum and/or the alane precursor.

12. The method of claim 5, further comprising soaking the N-metal film with an alloying agent, wherein the alloying agent comprises one or more of $SiH_4$, $GeH_4$, trimethylgallium, and $B_2H_6$.

13. The method of claim 5, wherein the N-metal film contains less than 20% carbon.

14. The method of claim 5, further comprising exposing the substrate surface to a fourth precursor comprising one or more of dimethylethylamine, dimethylcyclohexylamine or pyrrolidine alane during exposure to of the substrate to the alane precursor.

15. The method of claim 14, wherein the fourth precursor is a vapor precursor.

* * * * *

UNITED STATES PATENT AND TRADEMARK OFFICE
CERTIFICATE OF CORRECTION

PATENT NO. : 9,683,287 B2
APPLICATION NO. : 14/058406
DATED : June 20, 2017
INVENTOR(S) : Thompson et al.

It is certified that error appears in the above-identified patent and that said Letters Patent is hereby corrected as shown below:

On the Title Page

Item "(57)", Column 2, in "Abstract", Line 9, delete "precrursor" and insert -- precursor --, therefor.

Item "(57)", Column 2, in "Abstract", Lines 10-11, delete "diemthylcyclohexylamine" and insert -- dimethylcyclohexylamine --, therefor.

In the Specification

In Column 1, Line 5, delete "PARAGRAPH" and insert -- TO RELATED APPLICATION --, therefor.

In Column 3, Line 29, after "metal" insert -- . --.

In the Claims

In Column 10, in Claim 1, Lines 33-34, delete "dimethyaluminum" and insert -- dimethylaluminum --, therefor.

Signed and Sealed this
Third Day of October, 2017

Joseph Matal
*Performing the Functions and Duties of the*
*Under Secretary of Commerce for Intellectual Property and*
*Director of the United States Patent and Trademark Office*